United States Patent [19]

Gaultier et al.

[11] Patent Number: 5,270,710

[45] Date of Patent: Dec. 14, 1993

[54] SWITCH DEVICE WITH OPERATING MODES OF CAPACITIVE PROXIMITY AND MECHANICAL ACTUATION

[75] Inventors: Philippe Gaultier, Le Chesnay; Patrick Ferran, Paris; Patrick Vouillon, Villebon sur Yvette, all of France

[73] Assignee: Sextant Avionique S.A., France

[21] Appl. No.: 799,252

[22] Filed: Nov. 27, 1991

[30] Foreign Application Priority Data

Dec. 13, 1990 [FR] France .................. 90 15597

[51] Int. Cl.$^5$ .................... H03K 17/94; H03K 17/975; H03K 17/98
[52] U.S. Cl. ........................ 341/33; 341/34; 200/600
[58] Field of Search ............ 341/22, 21, 31, 32, 341/33, 34; 200/5 A, 600; 400/479.1, 479.2

[56] References Cited

U.S. PATENT DOCUMENTS

| | | | |
|---|---|---|---|
| 4,274,752 | 6/1981 | Huber et al. | 341/33 |
| 4,862,166 | 8/1989 | Yamakawa | 341/33 |

FOREIGN PATENT DOCUMENTS 490712  6/1992  European Pat. Off. .............. 341/33

OTHER PUBLICATIONS

Article, "Multistylus Keyboard for Manual Stylus Interactive Interface", Kambic et al, IBM Technical Disclosure Bulletin, vol. 12, No. 11, Apr. 1960, pp. 1863-1865.

Primary Examiner—Donald J. Yusko
Assistant Examiner—John Edward Giust
Attorney, Agent, or Firm—William A. Drucker

[57] ABSTRACT

A switch device with two modes of operation includes at least one switch comprising, carried by a substrate, two conductive lands and an electrically conductive elastic capsule in contact with one land and, in the unoperated condition, overlying the other land so as to be capable of being urged into contact with the latter. An electrical signal from a source is applied to the capsule. A circuit measures variations of the signal due to the proximity of an electrically conductive object. The device can be used to implement matrix keyboards combining the functions of a conventional keypad and a tactile pad.

10 Claims, 3 Drawing Sheets

SWITCH DEVICE WITH OPERATING MODES OF CAPACITIVE PROXIMITY AND MECHANICAL ACTUATION

BACKGROUND OF THE INVENTION

1. Field of the Invention

The present invention concerns a switch device with two operating modes, namely: a proximity sensing first operating mode and a direct mechanical action second operating mode.

It finds an advantageous, but by no means exclusive, application in the manufacture of keypads comprising a plurality of switch devices of this kind.

2. Description of the Prior Art

Many types of direct mechanical action switches have been proposed in the past, one of the simplest solutions entailing the use of an elastic capsule made from an electrically conductive material, as described in French patent application No 90 04065 (SEXTANT AVIONIQUE). The elastic capsule, in the form of a spherical dome, is usually disposed on a printed circuit board so that its perimeter is in electrical contact with one conductive area and it extends over a second conductive area electrically insulated from the first and substantially in line with the central area of the capsule.

It is clear that on applying to the capsule a pressure towards the printed circuit board the capsule is deformed until its central part touches the second area and so establishes an electrical contact between the two areas.

One particular objective of the present invention is to add to a switch of this type, which has the advantage of being extremely flat, compact and of low cost, a proximity sensing second operating mode without modifying the mechanical construction and therefore without increasing the overall dimensions and the thickness of the switch.

The simplest and most compact proximity sensing devices, namely capacitive effect proximity sensors, necessarily include an electrically conductive material sensing area mounted on a substrate and means of connecting this area an electronic circuit. Because it is necessarily disposed in line with the pushbutton of the switch, this land and its substrate are necessarily thin and flexible. Apart from the fact that it increases the thickness of the switch in any event, this solution has the drawback of being unreliable, the conductive area and/or the associated connections having a tendency to deteriorate in time. These drawbacks are considerably accentuated when it is required to construct a keypad because of the multiplicity of area, the connections between them and the large number of connecting members required.

One particular objective of the invention is to eliminate this drawback.

SUMMARY OF THE INVENTION

To this end, the present invention consists in a switch device with two operating modes, namely: a proximity sensing first operating mode and a direct mechanical action second operating mode, said device comprising at least one switch comprising at least one fixed contact member carried by a substrate and a mobile contact member adapted to be urged into contact with said fixed contact member, wherein at least one of said contact members is additionally employed as a sensing element of a capacitive proximity sensing device and comprises means for applying to said element an electrical signal and means for sensing variation of said signal due to the proximity of an electrically conductive object.

Of course, the circuit of the proximity sensing device may be separate from the purely mechanical switching circuit of the switch.

However, according to one particularly advantageous feature of the invention, the two circuits may be combined, the switch forming part of a local capacitive assembly having at least three levels of impedance, namely: a first level of impedance resulting from the open position of the switch in the absence of proximity sensing, a second level of impedance resulting from the sensing of a conductive member near the capsule (increasing the capacitance between the contacts), and a third level of impedance resulting from the closed position of the switch.

One embodiment of the invention is described hereinafter by way of non-limiting example and with reference to the appended diagrammatic drawings.

DETAILED DESCRIPTION OF THE INVENTION

Figure 1:
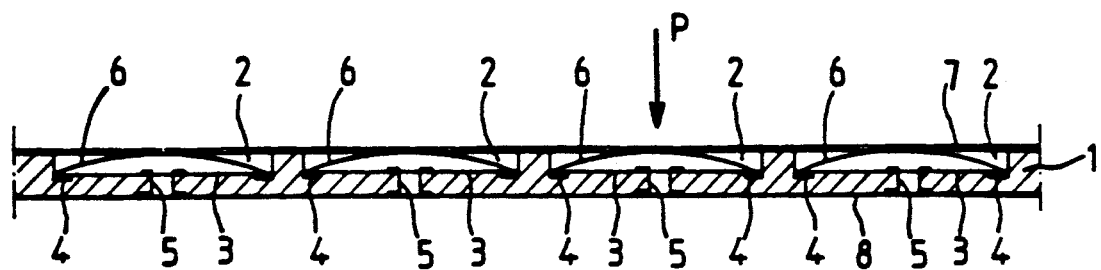
FIG. 1 is schematic view in transverse cross-section showing the mechanical structure of a keypad in accordance with the invention.

Referring to FIG. 1, the keypad comprises a flat substrate 1 in the form of a printed circuit board, for example, provided with a plurality of cylindrical spot faced cavities 2 each accommodating a respective switch.

The bottom 3 of each cavity 2 has an annular area of metal plating 4 whose outside diameter is substantially equal to the diameter of the cavity and a central area of metal plating 5 providing a fixed contact member.

In each cavity 2 is disposed an elastically deformable metal capsule 6 in the shape of a dome whose circular base has a diameter substantially equal to the diameter of the cavity 2. The base of the capsule 6 therefore bears on the annular area of metal plating 4 and its central part lies over the central area of metal plating 5.

The capsules 6 are held in the cavities by an elastically deformable plastics material film 7 which covers the upper surface of the substrate 1 and is fixed to it by adhesive bonding, for example.

The lower surface of the substrate 1 advantageously carries an electronic circuit (not shown) electrically connected to the annular areas of metal plating 4 and to the central areas of metal plating 5.

It is clear that, in the unoperated condition, the central part of each capsule 6 is away from the central area of metal plating 5, the switch formed by these two members being open.

Starting from this position, pressure P exerted on the top of the capsule 6 causes elastic deformation of the capsule 6 which, following reversing of the concavity (providing the tactile effect), comes into contact with the central area of metal plating 5. The switch is then closed.

The invention proposes to add to this first mode of operation of the keypad switches a proximity sensing type second mode of operation.

In the example shown in FIG. 2 this result is achieved as follows:

on the one hand, by associating locally with each switch I a capacitive circuit comprising in series between a terminal 8 to which is applied a high-frequency periodic signal produced by a generator 9 and a reference potential (ground M) a first capacitor $C_1$, a switch I and a second capacitor $C_2$ having a relatively high capacitance, the point J at which the first capacitor $C_1$ is connected to the switch I being grounded through a diode $D_1$ and a resistor $R_1$; and on the other hand, by sensing the voltage at the output S (the point where the diode $D_1$ is connected to the resistor $R_1$).

When the switch I is open and when there is no conductive member near the capsule 6 the signal applied to the terminal B is rectified and filtered. There results at S a signal at a first voltage $N_1$.

The effect of an electrically conductive body near the capsule 6 is to induce stray capacitance between the point S and ground. This causes a leakage current which attenuates the voltage at point J. The signal at the output S is therefore at a second level $N_2$ much lower than the first.

If the switch I is closed the point J is grounded through the capacitor $C_2$. Provided that a capacitor $C_2$ of sufficiently high capacitance is used, there is then obtained at the output S a very low or even null voltage signal level $N_3$.

Of course, the voltage signal at the point S may be analyzed by an analog system (compared with threshold voltages, for example), so as to discern the three levels and select respective commands accordingly. It may simply be applied to an analog/digital converter 10 driving a load circuit 11.

This solution is particularly advantageous in implementing a matrix type keypad.

Figure 2:
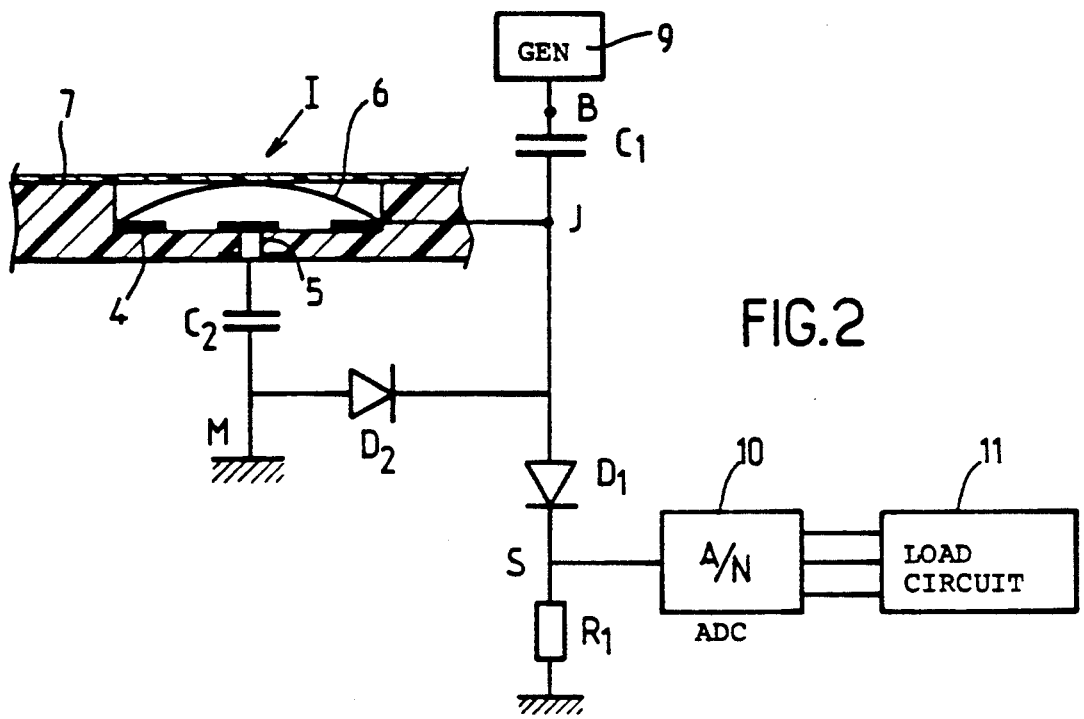
FIG. 2 is a block diagram of an electronic circuit adapted to be associated with a switch of the type shown in FIG. 1.
Figure 3:
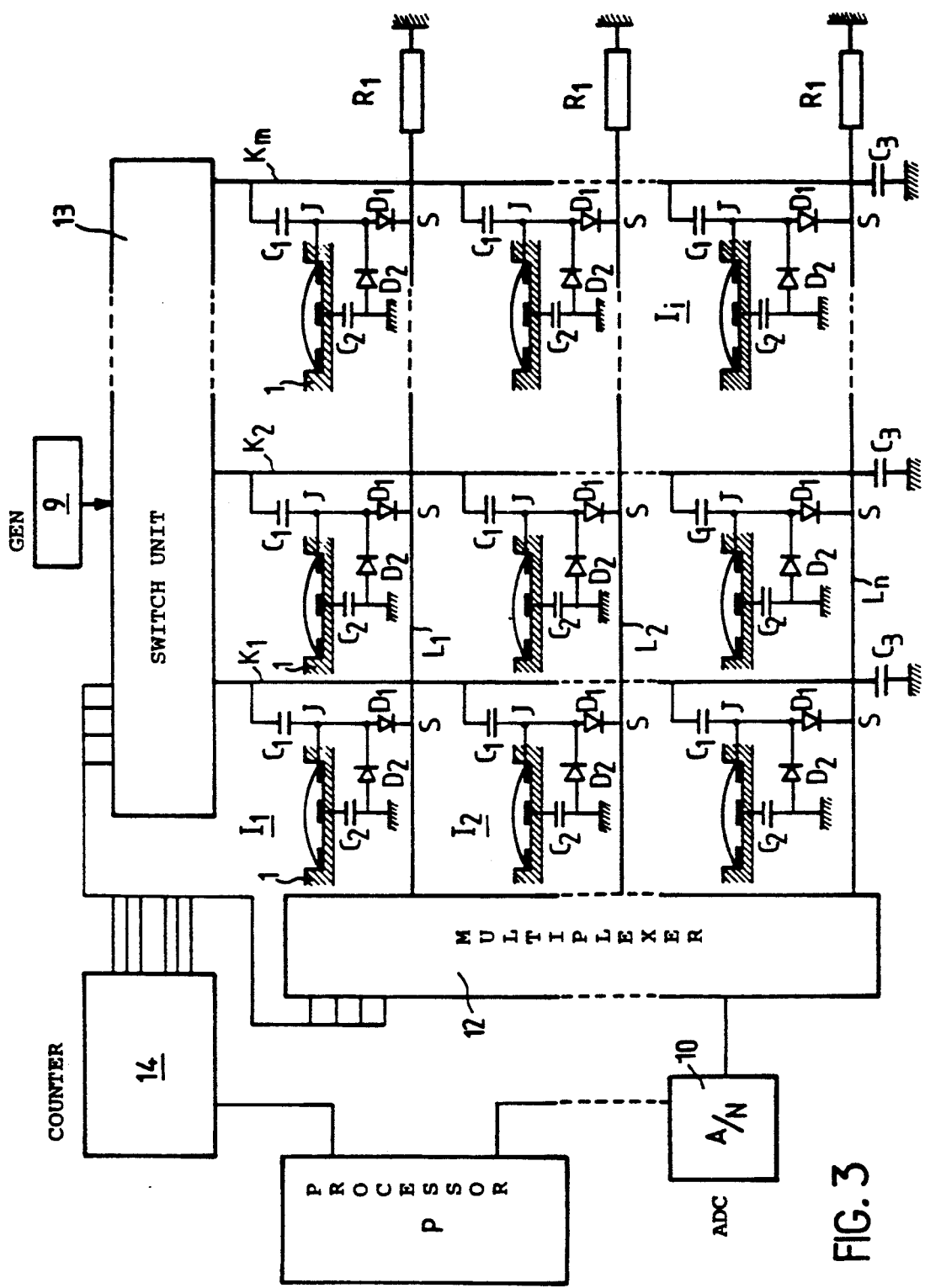
FIG. 3 is a block diagram of a matrix type keypad in accordance with the invention.

In this case, as shown in FIG. 3, the keypad may comprise:

a first succession of parallel conductors defining a series of rows $L_1, L_2, \ldots, L_n$ which may be deposited on one side of the printed circuit board used as the keypad substrate 1;

a second succession of parallel conductors defining a series of columns $K_1, K_2, \ldots, K_m$ perpendicular to said rows $L_1, L_2, \ldots, L_n$ and which may be deposited on the opposite side of the printed circuit board;

switches $I_1$ through $I_j$ of the type shown in FIGS. 1 and 2 disposed near respective row/column intersections.

Each of the rows $L_1, L_2, L_n$ is connected to a respective input of a multiplexer 12 and is grounded through a resistor $R_1$.

Each column is connected to an output of a switch unit 13 enabling successive application to the columns $K_1, K_2, \ldots, K_m$ of a high-frequency periodic signal (a 2 MHz squarewave signal) from a generator 9 and is grounded through a relatively low-value capacitor $C_3$.

The switch unit 13 and the multiplexer 12 are controlled by a common counter 14 to scan the keypad in a conventional sequence.

The output of the multiplexer 12 is applied to the input of an analog/digital converter 10 itself connected to a processor P.

Locally associated with each switch $I_1$ through $I_j$ is a capacitive circuit of the type shown in FIG. 2.

This circuit includes a circuit grounding the column K and including, connected in series, a first capacitor $C_1$, a switch I and a second capacitor $C_2$.

The point J at which the capacitor $C_1$ is connected to the switch is connected to a row $L_1, L_2, L_n$ by a forward-biased diode $D_1$ and grounded through a reverse-biased diode $D_2$.

This capacitive circuit operates in the same way as that described with reference to FIG. 2 and this operation will therefore not be described again.

At the keypad, on the other hand, the scanning cycle is as follows:

During a first period the switch unit 13 applies to the first column $K_1$ the high-frequency signal produced by the source 9. During this first period the multiplexer 12 successively connects the lines $L_1, L_2, L_n$ to the output.

During a second period the high-frequency signal is applied to the second column $K_2$ and the multiplexer 12 repeats the same sequence of connections.

This process is repeated up to the mth column $K_m$. The system has then finished the scanning cycle and can start a new cycle.

It is clear that with this type of scanning the processor detects at all times the status (the voltage at the point S) of a switch/capacitive circuit combination of known address.

When this combination is not affected by the proximity of an electrically conductive object, the voltage at the output of the multiplexer will have a maximum value (level $N_1$). As shown in the FIG. 4 diagram, this maximal value fluctuates slightly from one system to the next (in the area $z_1$), the resistors $R_1$ and the capacitors $C_3$ setting these voltages to values as close as possible to the required value.

Figure 4:
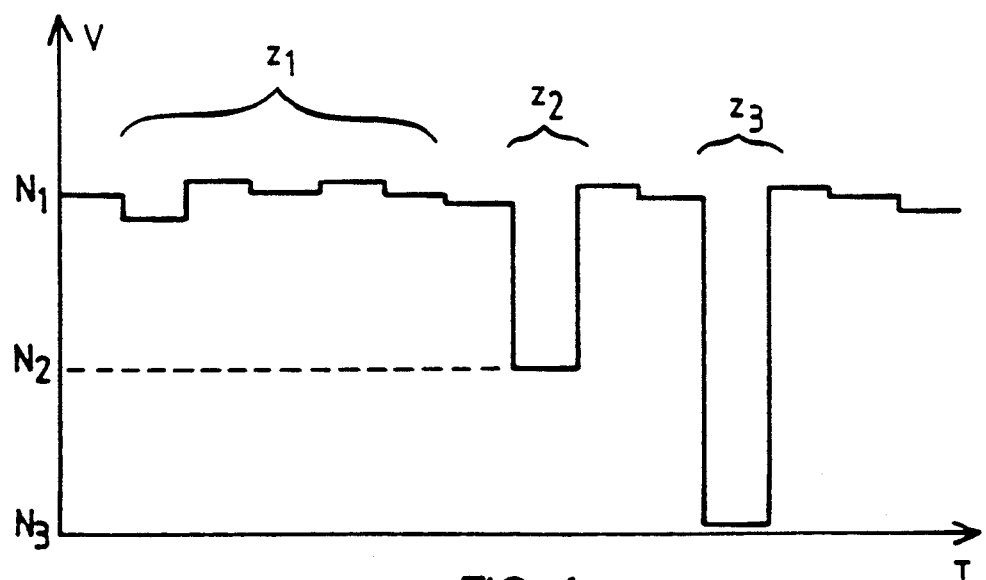
FIG. 4 is a diagram showing the variation with time in the voltage across the capsule of a switch in each of its operating modes.

If a system is affected by the presence of an electrically conductive object, because of the stray current caused by the increased capacitance between the capsule 6 and the fixed contact 5 of the switch I the voltage at the output of the multiplexer 12 will have an intermediate value (level $N_2$) much lower than the maximum value (in area $z_2$, FIG. 4).

If the switch I is closed, the voltage at the output of the multiplexer 12 will be minimal or even null (level $N_3$) (in area $z_3$, FIG. 4).

Its two operating modes enable a switch in accordance with the invention to be used in many applications.

Figure 5:
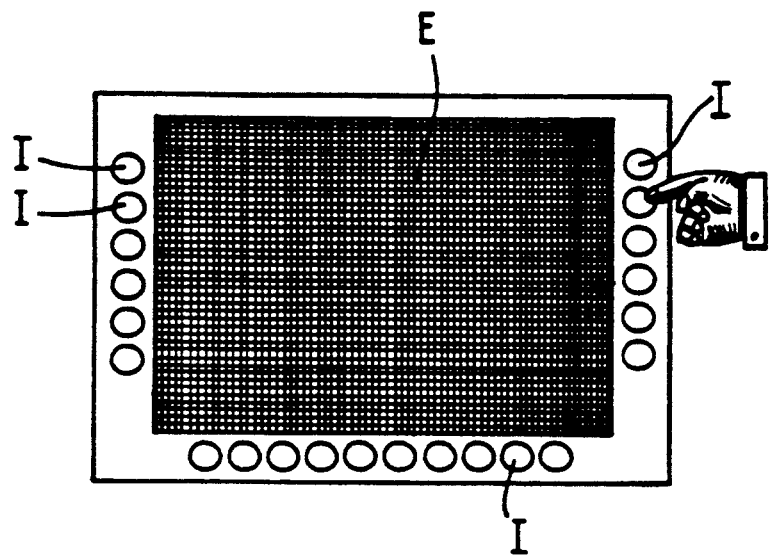
FIG. 5 and FIG. 6 are diagrammatic representations of two different modes of use of switch devices in accordance with the invention.

FIG. 5 shows one application in which the switches I are placed at the edges of a screen E and implement simultaneously line key and tactile surface functions. Running a finger along the tactile surface to scan a menu, for example, provides a "scrolling" function for moving within an image or a text larger than the screen, for incrementing or decrementing a numerical value, for moving a cursor and/or for confirming an option or operation.

Figure 6:
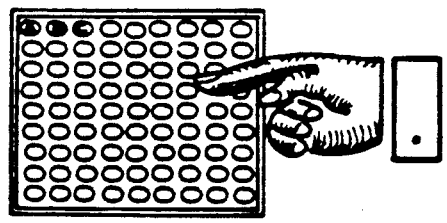

FIG. 6 shows a matrix type keypad as previously described which has the special feature of providing conventional keypads and tactile pad functions within the same overall dimensions.

In this type of application the processor associated with the keypad may advantageously calculate the "center of mass" of the switches affected at any given time by the proximity of an operator's finger, for example.

Processing of this kind, as described in French patent applications Nos 87 07323 and 90 06820, provides much higher resolution than a conventional type proximity sensing keypad.

There is claimed:

1. Switch device with two operating modes, namely: a proximity sensing first operating mode and a direct mechanical action second operating mode, said device comprising at least one mechanical switch comprising at least one fixed contact member carried by a substrate and a mobile contact member adapted to be urged into contact with said fixed contact member, wherein at least one of said contact members is additionally employed as a sensing element of a capacitive proximity sensing device and comprises means for applying to said element an electrical signal and means for sensing variations in said signal due to the proximity of an electrically conductive object.

2. Device according to claim 1, wherein said mechanical switch comprises two-fixed contact members in the form of two conductive areas carried by said substrate and a mobile contact bridge which is in electrical contact with one of said two areas and in the unoperated condition overlies the second area, said mobile contact bridge functioning also as the sensing element of said sensing device.

3. Device according to claim 2, wherein said mobile contact bridge is an elastic capsule.

4. Device according to claim 1, wherein said proximity sensing device is independent of the purely mechanical switching circuit of said mechanical switch.

5. Device according to claim 1, wherein said mechanical switch is part of a capacitive circuit having at least three levels of impedance, namely: a first level of impedance resulting from the open position of said mechanical switch in the absence of proximity sensing; a second level of impedance resulting from the open position of said mechanical switch in the presence of proximity sensing; and a third level of impedance resulting from the closed position of said mechanical switch.

6. Device according to claim 5, wherein said capacitive circuit comprises connected in series between a terminal to which a high-frequency periodic signal is applied by a generator and a terminal adapted to be held at a reference potential a first capacitor, said mechanical switch and a second capacitor, the point at which said first capacitor is connected to said mechanical switch being connected to said reference potential by a diode and a resistor and said sensing means being adapted to sense a voltage at an output.

7. Device according to claim 6 comprising means for analyzing the voltage at said output.

8. Device according to claim 7 wherein said analyzer means are analog analyzer means.

9. Device according to claim 7, wherein said analyzer means comprise an analog to digital converter connected to a processor.

10. Device according to claim 1, comprising a plurality of said mechanical switches laid out in a matrix configuration and comprising:
- a first succession of parallel conductors defining a series of rows each connected at one end to a respective input of a multiplexer;
- a second succession of parallel conductors defining a series of columns perpendicular to said rows each connected to an output of a switch unit adapted to apply successively to said columns a high-frequencey periodic signal;
- at each row/column intersection a mechanical switch associated with a capacitive circuit comprising connected in series between the column and a reference potential a first capacitor, said mechanical switch and a second capacitor, the point at which said first capacitor is connected to said mechanical switch being connected to said line by a diode.

* * * * *